(12) United States Patent
Yamashita

(10) Patent No.: US 10,549,534 B2
(45) Date of Patent: *Feb. 4, 2020

(54) LIQUID DISCHARGE HEAD AND LIQUID DISCHARGE APPARATUS INCLUDING THE SAME

(71) Applicant: Brother Kogyo Kabushiki Kaisha, Nagoya-shi, Aichi-ken (JP)

(72) Inventor: Toru Yamashita, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/406,358

(22) Filed: May 8, 2019

(65) Prior Publication Data

US 2019/0329552 A1   Oct. 31, 2019

Related U.S. Application Data

(63) Continuation of application No. 15/915,249, filed on Mar. 8, 2018, now Pat. No. 10,322,582.

(30) Foreign Application Priority Data

Mar. 31, 2017  (JP) ................................ 2017-070055

(51) Int. Cl.
*B41J 2/14*  (2006.01)
*B41J 2/16*  (2006.01)

(52) U.S. Cl.
CPC .......... *B41J 2/14233* (2013.01); *B41J 2/161* (2013.01); *B41J 2002/14491* (2013.01); *B41J 2202/18* (2013.01)

(58) Field of Classification Search
CPC .......... B41J 2/14233; B41J 2002/14491; B41J 2/14201; B41J 2/14072; B41J 2202/18
See application file for complete search history.

(56) References Cited

U.S. PATENT DOCUMENTS

| 6,796,640 B2 | 9/2004 | Miyata |
| 10,322,582 B2 * | 6/2019 | Yamashita .......... H01L 41/0478 |
| 2003/0117464 A1 | 6/2003 | Miyata |
| 2009/0153607 A1 | 6/2009 | Abe |

FOREIGN PATENT DOCUMENTS

| JP | 2003-246065 A | 9/2003 |
| JP | 2013-000992 A | 1/2013 |

\* cited by examiner

*Primary Examiner* — Geoffrey S Mruk
(74) *Attorney, Agent, or Firm* — Banner & Witcoff, Ltd.

(57) ABSTRACT

A liquid discharge head is provided. The liquid discharge head includes: a semiconductor substrate including a first pressure chamber; an insulating film disposed above the semiconductor substrate; a first piezoelectric element disposed on an opposite side to the first pressure chamber of the insulating film and having a piezoelectric layer and a first and second electrode; and a doped layer formed in the semiconductor substrate. The doped layer partitions at least part of the first pressure chamber and has a lower electrical resistivity than the insulating film and the semiconductor substrate. A through hole having a conductor disposed on its inside is formed in the insulating film, and the first electrode and the doped layer are electrically continuous via the conductor.

10 Claims, 16 Drawing Sheets

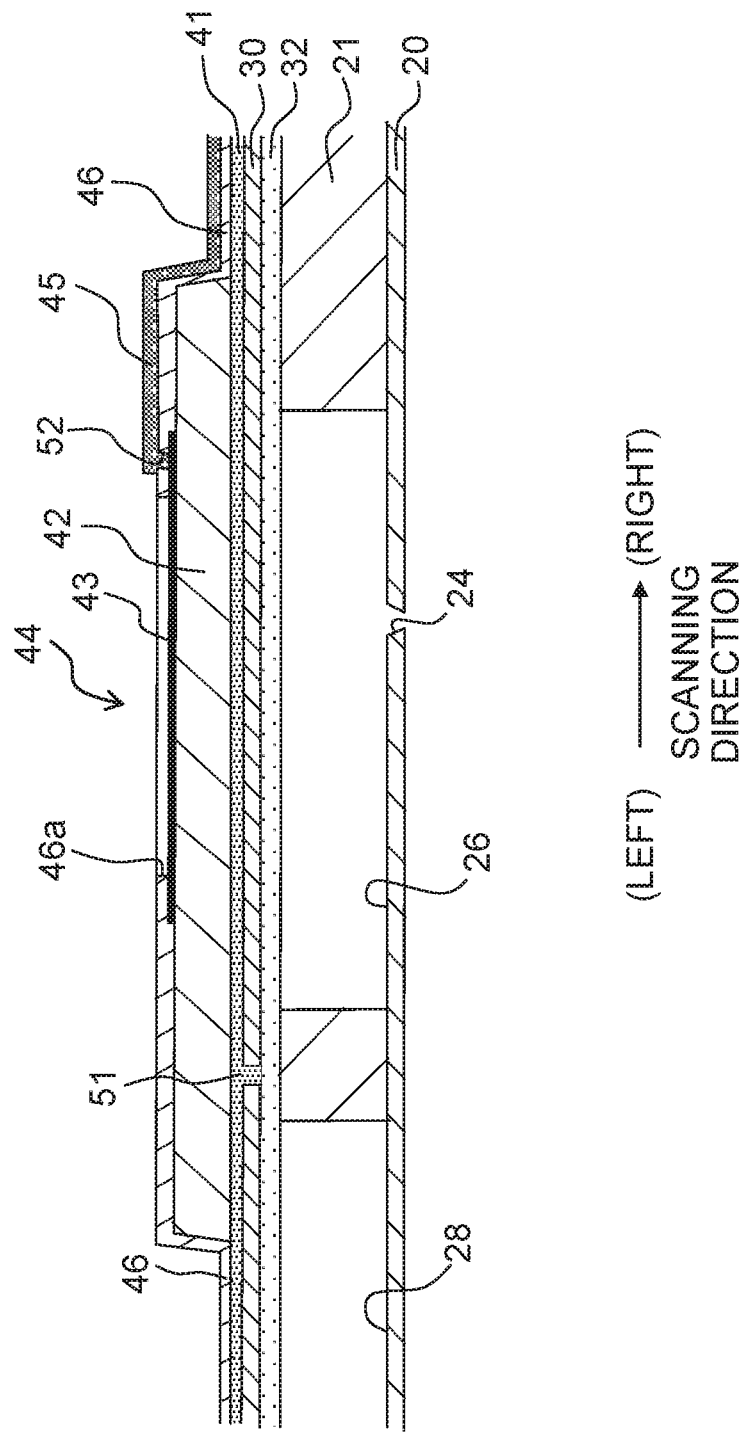

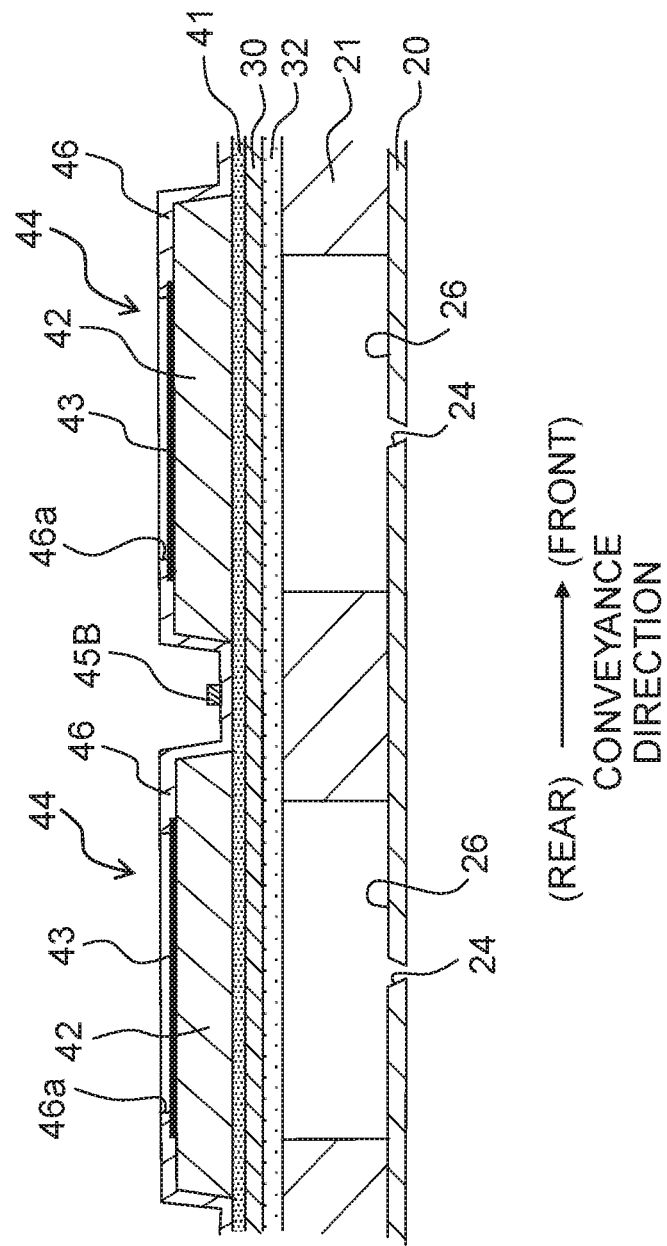

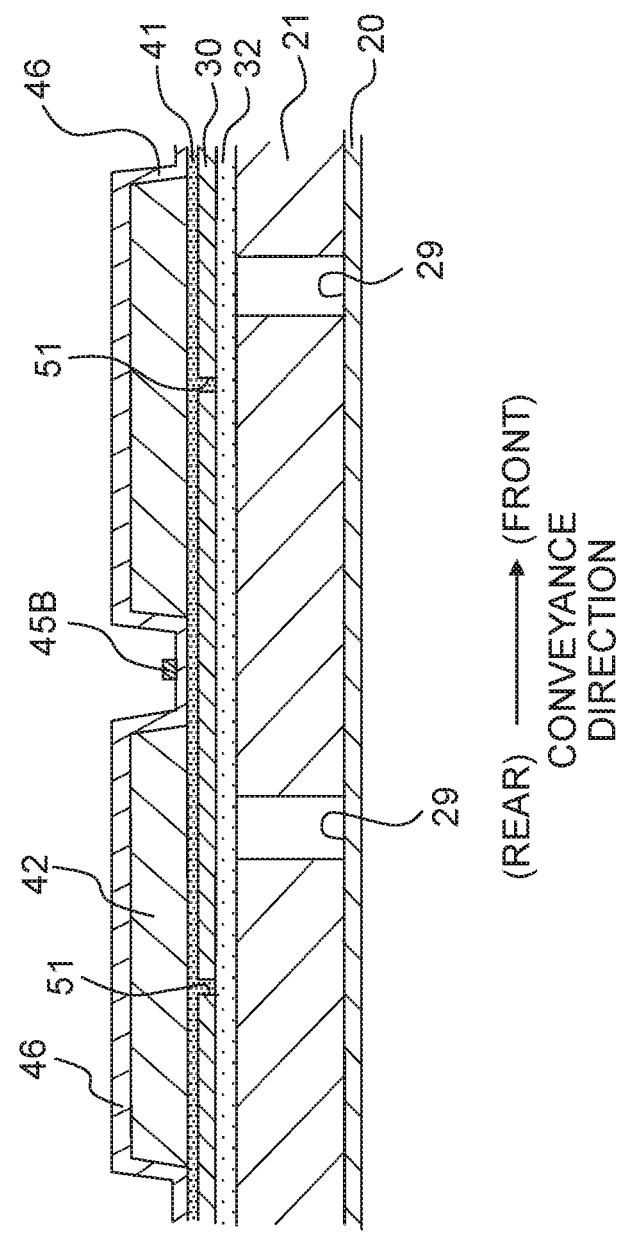

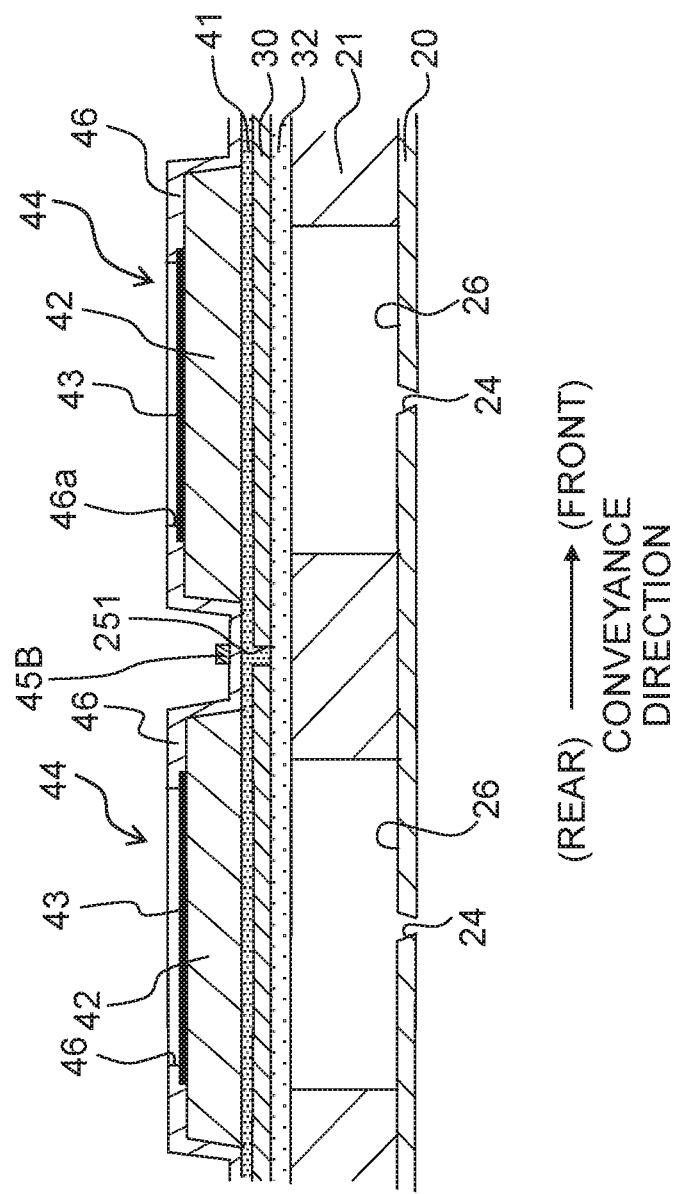

LIQUID DISCHARGE HEAD AND LIQUID DISCHARGE APPARATUS INCLUDING THE SAME

CROSS REFERENCE TO RELATED APPLICATION

The present application is a continuation of U.S. patent application Ser. No. 15/915,249 filed Mar. 8, 2018 which claims priority from Japanese Patent Application No. 2017-070055 filed on Mar. 31, 2017, the disclosures of which are incorporated herein by reference in their entirety.

BACKGROUND

Field of the Invention

The present teaching relates to a liquid discharge head that discharges liquid such as ink toward a medium, and relates also to a liquid discharge apparatus that includes said liquid discharge head.

Description of the Related Art

There is known as a liquid discharge apparatus an ink-jet head of an ink-jet printer, that while moving relatively to a recording medium, discharges ink onto the recording medium to form an image. For example, an ink-jet head that includes a nozzle plate, a channel substrate, and a plurality of piezoelectric elements, is publicly known. The nozzle plate has a plurality of nozzles formed therein. The channel substrate is formed by a silicon single crystal substrate, and is joined to the nozzle plate. The channel substrate has formed therein a plurality of pressure chambers respectively communicating with the plurality of nozzles and a manifold that supplies ink to the plurality of pressure chambers. An upper surface of the channel substrate has formed therein an insulating film configured from silicon dioxide formed by performing heat treatment on the silicon single crystal substrate. The plurality of piezoelectric elements are disposed respectively corresponding to the plurality of pressure chambers, on the insulating film formed in the upper surface of the channel substrate.

When a semiconductor substrate such as a silicon single crystal substrate is employed as the channel substrate as in the above-described ink-jet head, the ink-jet head can be manufactured applying a semiconductor manufacturing process. As a result, an ink-jet head which is small-sized and has a high disposing density of nozzles can be manufactured cheaply. However, in this kind of ink-jet head, a thickness of the insulating film partitioning the piezoelectric element and ink in the pressure chamber is configured to be extremely thin, and a crack sometimes occurs in an elastic film in the process of manufacturing the ink-jet head.

SUMMARY

In the above-mentioned ink-jet head, when a crack has occurred in the insulating film, there is a possibility that as will be mentioned later, ink in the pressure chamber enters the crack causing the ink and a lower electrode to short-circuit.

An object of the present teaching is that even when a crack has occurred in an insulating film of an ink-jet head, it is prevented that ink in a pressure chamber enters the crack causing a lower electrode and the ink to short-circuit.

An aspect of the present teaching, there is provided a liquid discharge head including: a semiconductor substrate including a first pressure chamber; an insulating film disposed above the first pressure chamber; a first piezoelectric element disposed on an opposite side to the first pressure chamber of the insulating film, in a first direction in which the first pressure chamber and the insulating film overlap, the first piezoelectric element including: a first electrode disposed above the insulating film, a piezoelectric layer disposed above the first electrode, and, a second electrode disposed above the piezoelectric layer. A semiconductor substrate further includes a doped layer, wherein the doped layer defines at least part of the first pressure chamber. The doped layer has a lower electrical resistivity than the insulating film and the semiconductor substrate. The insulating film includes a through hole in which a conductor is disposed, and the first electrode and the doped layer are electrically connected to the conductor disposed in the through hole.

Due to the above-described configuration, a doped layer whose electrical resistivity is lower than those of a semiconductor substrate and an insulating film is formed in the semiconductor substrate. Since this doped layer partitions at least part of a pressure chamber, a liquid filled into the pressure chamber can electrically contact the doped layer. Moreover, the doped layer is connected to a first electrode of a first piezoelectric element via a conductor disposed in a through hole. Therefore, the first electrode and the liquid filled into the pressure chamber are electrically connected via the doped layer and the conductor disposed in the through hole. As a result, by performing grounding, and so on, of the first electrode to keep it at a constant potential, a potential of the liquid in the pressure chamber can be easily set to a constant potential. Therefore, even when a crack has occurred in the insulating film of a liquid discharge head, it can be suppressed that ink in the pressure chamber enters the crack, and it can be prevented that the ink and a piezoelectric element short-circuit.

BRIEF DESCRIPTION OF THE DRAWINGS

FIG. 6 is a cross-sectional view taken along the line VI-VI of FIG. 4.

FIG. 7 is a cross-sectional view taken along the line VII-VII of FIG. 4.

FIG. 8 is a cross-sectional view taken along the line VIII-VIII of FIG. 4.

FIG. 16 is a view corresponding to FIG. 7 depicting a case where a through hole 251 has been provided between two pressure chambers 26 in a conveyance direction.

DESCRIPTION OF THE EMBODIMENTS

Figure 1:
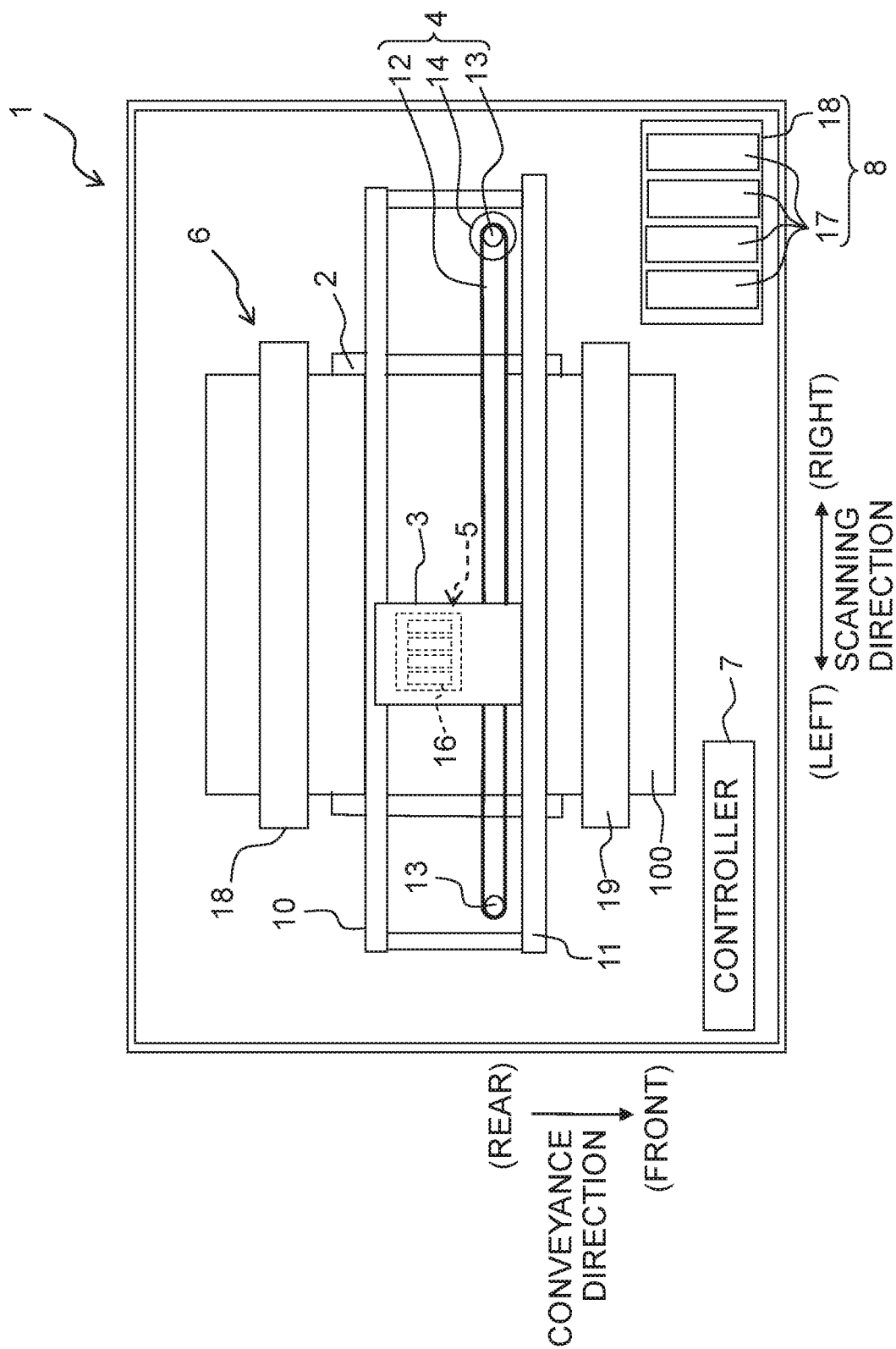
FIG. 1 is a plan view depicting an outline of an ink-jet printer 1 according to the present embodiment.

An embodiment of the present teaching will be described. FIG. 1 is a plan view depicting an outline of an ink-jet printer 1 according to the present embodiment. Each of directions of front, rear, left, and right depicted in FIG. 1 are defined as "front", "rear", "left", and "right" of the ink-jet printer 1. Moreover, this side of the paper surface is defined as "up", and the far side of the paper surface is defined as "down".

<Schematic Configuration of Printer>

As depicted in FIG. 1, the ink-jet printer 1 mainly includes a platen 2, a carriage 3, a carriage drive mechanism 4, an ink-jet head 5, a conveyance mechanism 6, a controller 7, and an ink supply unit 8.

A recording sheet 100 which is a recording medium is placed on an upper surface of the platen 2. The carriage 3 is configured so as to make reciprocating movement in a left-right direction (hereafter, also called a scanning direction) along two guide rails 10, 11 in a region facing the platen 2, by the carriage drive mechanism 4. The carriage drive mechanism 4 includes: a belt 12; two rollers 13 disposed so as to sandwich the platen 2 on both sides in the scanning direction of the platen 2; and a carriage drive motor 14. The belt 12 is coupled to the carriage 3. The belt 12 is stretched around so as to form an elliptically shaped loop long in the scanning direction when viewed from above, between the two rollers 13 disposed separated in the scanning direction. As depicted in FIG. 1, the roller 13 on a right side is coupled to a rotating shaft of the carriage drive motor 14. By rotating the carriage drive motor 14, the belt 12 can be circulated around the two rollers 13. Consequently, the carriage 3 coupled to the belt 12 can be caused to make reciprocating movement in the scanning direction.

The ink-jet head 5 is attached to the carriage 3 and moves in the scanning direction along with the carriage 3. The ink-jet head 5 includes four head units 16 aligned in the scanning direction. Moreover, the ink supply unit 8 includes: four ink cartridges 17 in which inks of four colors (black, yellow, cyan, magenta) have been respectively stored; a cartridge holder 18 fitted with the four ink cartridges 17; and unillustrated tubes. The four head units 16 and the four ink cartridges 17 are respectively connected via the unillustrated tubes. As a result, the inks of the four colors are supplied from the ink supply unit 8 to the four head units 16.

Figure 3:
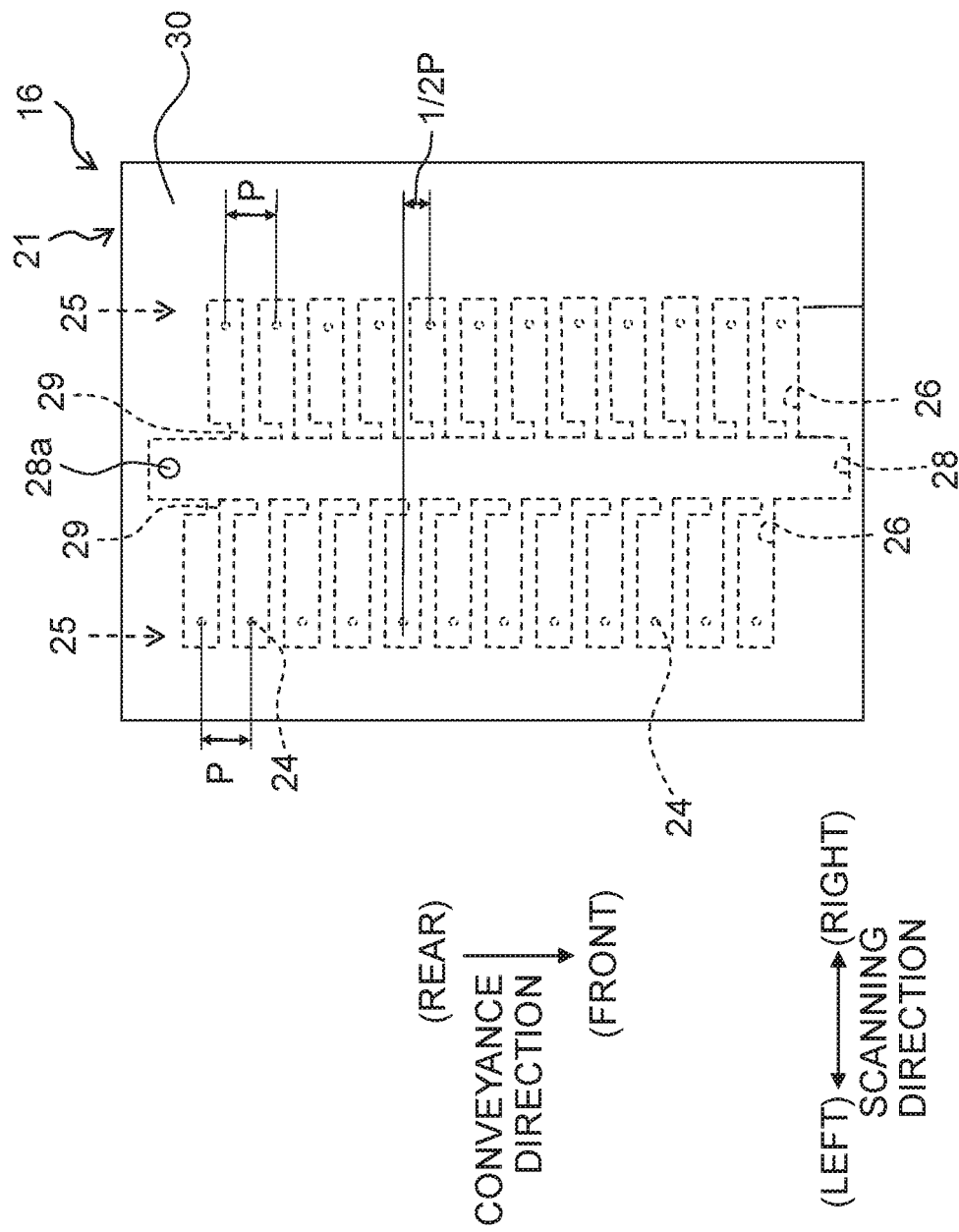
FIG. 3 is a schematic top view depicting a state where piezoelectric elements 44, wirings 45, a protective film 46, drive contacts 53, and ground contacts 54, of the head unit 16 depicted in FIG. 2 have been removed.

A plurality of nozzles 24 are formed in a lower surface (a surface on the far side of the paper surface of FIG. 1) of each of the head units 16 (refer to FIG. 3). The nozzles 24 of each of the head units 16 discharge toward the recording sheet 100 placed on the platen 2 the ink supplied from the ink cartridge 17.

The conveyance mechanism 6 has two conveyance rollers 18, 19 disposed so as to sandwich the platen 2 in a front-rear direction. The conveyance mechanism 6 conveys the recording sheet 100 placed on the platen 2 frontwards (in what is hereafter also called a conveyance direction) by the two conveyance rollers 18, 19.

The controller 7 includes the likes of a ROM (Read Only Memory), a RAM (Random Access Memory), and an ASIC (Application Specific Integrated Circuit) that includes a control circuit. The controller 7 executes various kinds of processing, such as printing, on the recording sheet 100, by the ASIC, according to a program stored in the ROM. For example, in a printing processing, the controller 7 controls the likes of the ink-jet head 5 or carriage drive motor 14 to print an image on the recording sheet 100, based on a printing instruction inputted from an external apparatus such as a PC. Specifically, the controller 7 causes an ink discharge operation and a conveyance operation to be alternately performed. The ink discharge operation discharges ink while moving the ink-jet head 5 along with the carriage 3 in the scanning direction, and the conveyance operation conveys a certain amount of the recording sheets 100 in the conveyance direction by the conveyance rollers 18, 19.

Next, a configuration of the head unit 16 of the ink-jet head 5 will be described. Note that since the four head units 16 of the ink-jet head 5 all have the same configuration, a description of one of those four head units 16 will be made, and descriptions of the other head units 16 will be omitted.

Figure 2:
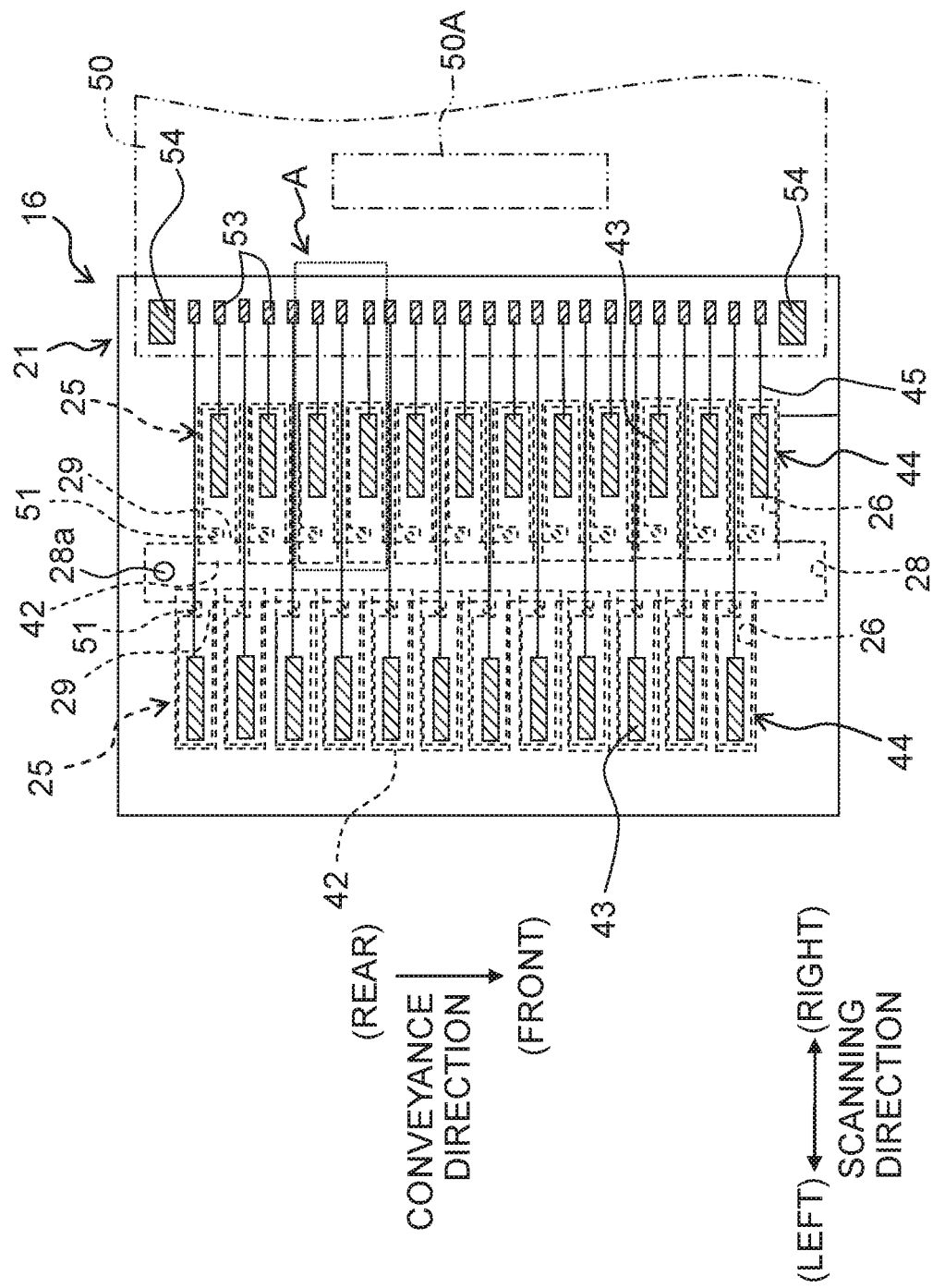
FIG. 2 is a schematic top view of one head unit 16 of an ink-jet head.
Figure 4:
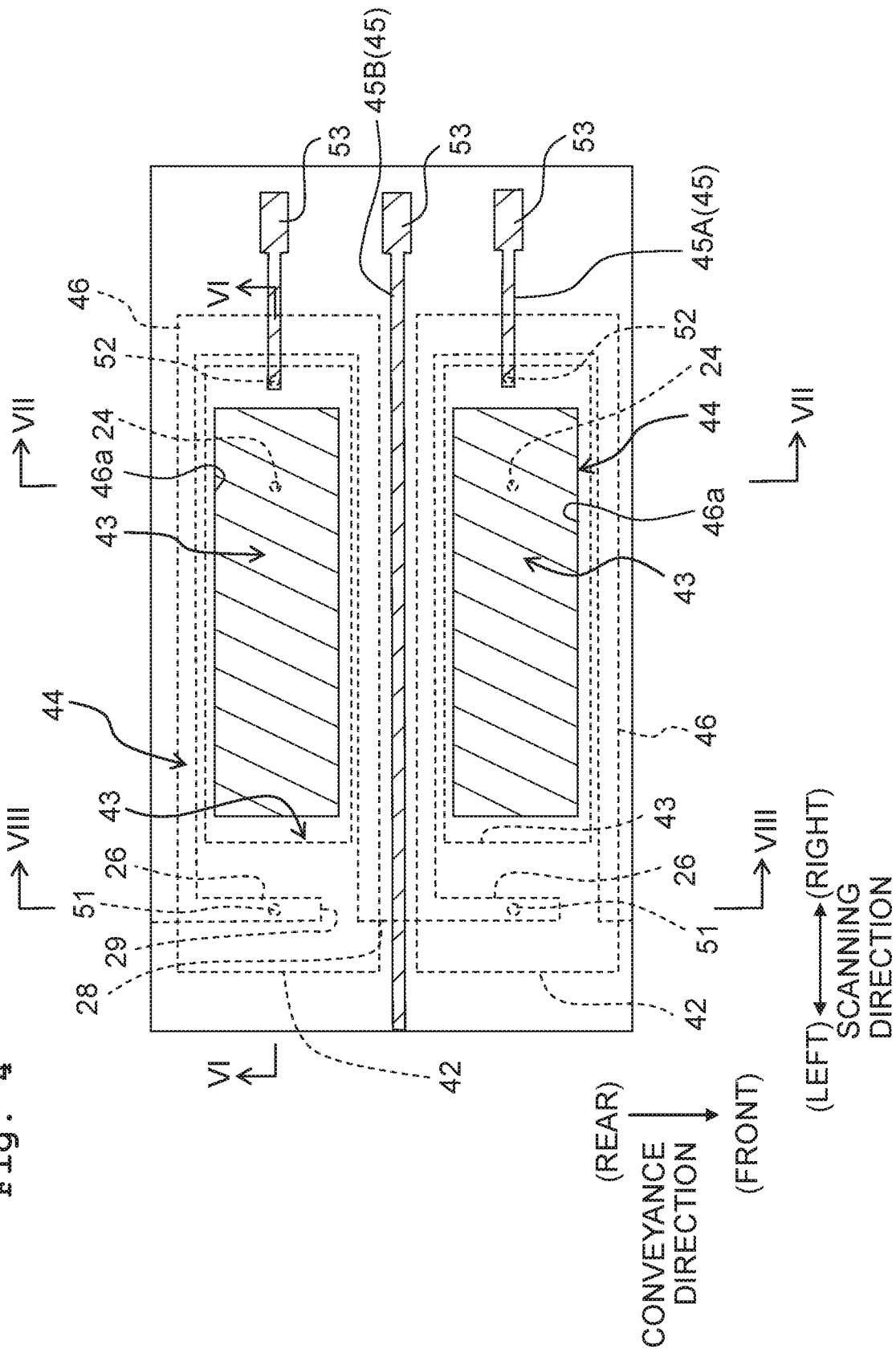
FIG. 4 is an enlarged view of section A of FIG. 2.
Figure 5:
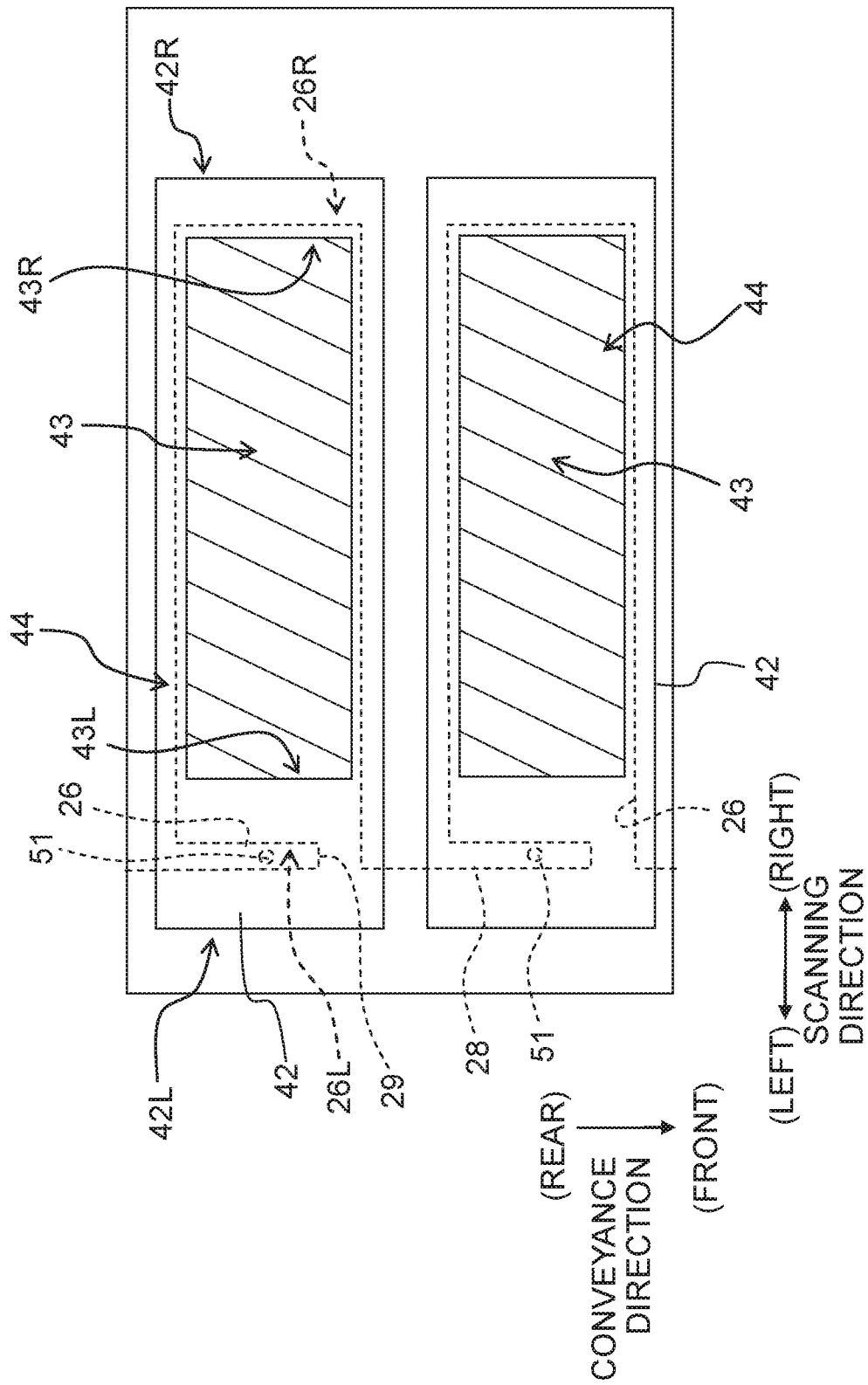
FIG. 5 is a view depicting a state where the protective film 46, the wirings 45, the drive contacts 53, and the ground contacts 54 have been removed from FIG. 4.

The head unit 16 mainly includes a nozzle substrate 20, a channel substrate 21, an insulating film 30, a piezoelectric element 44, a wiring 45, and a protective film 46 (refer to FIG. 6). In the description below, the nozzle substrate 20, the channel substrate 21, and the insulating film 30 of the head unit 16, and an ink channel formed on an inside of the channel substrate 21, will be described. Note that FIG. 2 is a schematic top view of the head unit 16. In order to simplify the drawing, FIG. 2 omits illustration of the later-described nozzle 24. FIG. 3 is a schematic top view depicting a state where the piezoelectric element 44, the wiring 45, and the protective film 46, of the head unit 16 depicted in FIG. 2 have been removed. FIG. 4 is a view enlarging a portion of a frame line A of FIG. 2. FIG. 5 is a view depicting a state where the protective film 46 has been removed from FIG. 4 in order to simplify the drawing.

<Nozzle Substrate 20>

The nozzle substrate 20 is a silicon single crystal substrate. Note that the nozzle substrate 20 can also be formed by the likes of a metal material such as stainless steel, or a synthetic resin material such as polyimide. As depicted in FIGS. 6 and 7, the plurality of nozzles 24 are formed in the nozzle substrate 20. Moreover, as depicted in FIG. 3, the plurality of nozzles 24 configure a nozzle column 25 arranged in the conveyance direction with an arrangement pitch P, and two of such nozzle columns 25 are formed. The two nozzle columns 25 are disposed aligned in the scanning direction. Moreover, positions of the nozzles 24 in the conveyance direction are misaligned by half of the arrangement pitch P of each of the nozzle columns 25 (P/2), between the two nozzle columns 25.

<Channel Substrate 21>

The channel substrate 21 is a silicon single crystal substrate. As depicted in FIG. 3, the following are formed in the channel substrate 21, namely: a plurality of pressure chambers 26 that respectively communicate with the plurality of nozzles; a common liquid chamber 28; and a plurality of channels 29 that communicate the plurality of pressure chambers 26 and the common liquid chamber 28. The plurality of pressure chambers 26 configure a pressure chamber column 27 arranged in the conveyance direction, and two of such pressure chamber columns 27 are formed. These two pressure chamber columns 27 are aligned in the scanning direction. Each of the pressure chambers 26 has a substantially rectangular shape long in the scanning direction in top view. The common liquid chamber 28 is provided between the two pressure chamber columns 27 in the scanning direction. The common liquid chamber 28 has a substantially rectangular shape long in the conveyance direction in top view. A rear end section in the conveyance direction, of the common liquid chamber 28 is positioned even more rearwards than those of the two pressure chamber columns 27. Similarly, a front end section in the conveyance direction, of the common liquid chamber 28 is positioned even more frontwards than those of the two pressure chamber columns 27. As depicted in FIG. 3, a supply port 28a for supplying ink to inside the common liquid chamber 28 is provided between a rear end of the common liquid chamber 28 and the most rearward positioned pressure chamber 26 in the conveyance direction (the front-rear direction). Ink from the ink cartridge 17 is supplied, via the unillustrated tube, to the supply port 28a.

As depicted in FIGS. 3 to 5, the channel 29 is formed between the common liquid chamber 28 and each of the pressure chambers 26. A liquid in the common liquid chamber 28 is supplied to each of the pressure chambers 26 via the channel 29.

FIG. 7 is a cross-sectional view taken along the line VII-VII of FIG. 4, and depicts a cross-sectional view of the pressure chamber 26. FIG. 8 is a cross-sectional view taken along the line VIII-VIII of FIG. 4, and depicts a cross-sectional view of the channel 29. By looking at FIGS. 7 and 8, it may be understood that a width (a length in the conveyance direction) of the channel 29 is configured narrower than a width of the pressure chamber 26. Since the width of the channel 29 is configured narrower than the width of the pressure chamber 26 in this way, a channel resistance of the channel 29 can be increased. It is suppressed that a pressure wave generated in ink in the pressure chamber 26 escapes to the common liquid chamber 28 when, as will be mentioned later, the piezoelectric element 44 and the insulating film 30 cooperate to apply pressure to the ink in the pressure chamber 26.

As depicted in, for example, FIG. 6, the insulating film 30 is formed on a channel substrate 21 upper surface. Now, the insulating film 30 is formed over an entire upper surface of the channel substrate 21, and the plurality of pressure chambers 26 are covered by the insulating film 30 (refer to FIG. 3). In the present embodiment, the insulating film 30 is a silicon dioxide ($SiO_2$) film formed by oxidizing a surface of the silicon channel substrate 21. Note that the insulating film 30 may be a silicon nitride (SiNx) film formed by nitridizing the surface of the silicon channel substrate 21. Note that the insulating film 30 is not limited to being formed by oxidizing or nitridizing the surface of the silicon channel substrate 21. The insulating film 30 need only be formed as a film of an insulator, and can also be formed by depositing the film of the insulator on the upper surface of the channel substrate 21 by a publicly known deposition technology such as sputtering. Moreover, the insulating film 30 need not necessarily be a single layer film, and may be a film formed by a plurality of layers.

Furthermore, a doped layer 32 formed by doping the channel substrate 21 with an impurity ion such as a sodium ion, for example, is formed on a lower side of the insulating film 30, of the channel substrate 21. The doped layer 32 is formed on the lower side of the insulating film 30 (refer to FIG. 6). Moreover, because the doped layer 32 is located on the lower side of the insulating film 30, the doped layer 32 is formed over an entire region of the upper surface of the channel substrate 21 and has the same shape as the insulating film 30 in top view, although this is not depicted in FIG. 3. An upper surface of the pressure chamber 26 is covered by the doped layer 32, and an upper surface of the doped layer 32 is further covered by the insulating film 30 (refer to FIG. 6). Note that as will be mentioned later, the doped layer 32 is a region whose conductivity has been raised as a result of the silicon channel substrate 21 having been doped with the impurity ion, and resistivity (specific resistance) of the doped layer 32 is configured lower than resistivity of the silicon configuring the channel substrate 21.

<Piezoelectric Element 44>

The plurality of piezoelectric elements 44 are provided respectively corresponding to the plurality of pressure chambers 26. Each of the piezoelectric elements 44 cooperates with the insulating film 30 to change a capacity of a corresponding pressure chamber 26. As a result, each of the piezoelectric elements 44 cooperates with the insulating film 30 to apply pressure to ink in the corresponding pressure chamber 26 and thereby provide the ink with energy for discharging the ink from the nozzle 24 communicating with said pressure chamber 26. As depicted in, for example, FIGS. 6 and 7, the plurality of piezoelectric elements 44 are respectively disposed above each of the pressure chambers 26, on the upper surface of the above-mentioned insulating film 30. The piezoelectric element 44 has a common electrode (lower electrode) 41, a piezoelectric layer 42, and an individual electrode (upper electrode) 43.

A configuration of the piezoelectric element 44 will be described below. The plurality of piezoelectric elements 44 are disposed so as to respectively face the plurality of pressure chambers 26, sandwiching the insulating film 30 and the doped layer 32. Note that as depicted in FIG. 2, the plurality of piezoelectric elements 44 configure two columns of piezoelectric elements 44 arranged in the conveyance direction according to an arrangement of the pressure chambers 26, and these two columns of piezoelectric elements 44 are aligned in the scanning direction.

The common electrode 41 is formed on the upper surface of the insulating film 30 so as to cover the whole of the insulating film 30. Although illustration of the common electrode 41 is omitted in FIG. 3, the common electrode 41 has substantially the same shape as the insulating film 30 in top view. The common electrode 41 need only be formed by a material having conductivity, and a material of the common electrode 41 is not particularly limited. For example, one having a two layer structure of platinum (Pt) and titanium (Ti) may be adopted.

The piezoelectric layers 42 are respectively disposed in portions overlapping the plurality of pressure chambers 26 in the up-down direction, of an upper surface of this common electrode 41. The piezoelectric layer 42 is configured by a piezoelectric material whose principal component is lead zirconate titanate (PZT) which is a mixed crystal of lead titanate and lead zirconate. Alternatively, the piezoelectric layer 42 may be formed by a non-lead based piezoelectric material not containing lead.

As mentioned above, FIG. 4 is a view enlarging the portion of the frame line A of FIG. 2, and FIG. 5 is a view depicting a state where the protective film 46, a drive contact 53, and a ground contact 54 have been removed from FIG. 4 in order to simplify the drawing. Note that FIG. 5 also omits illustration of the nozzle 24 and a continuity section 52. As depicted in FIGS. 4 and 5, each of the piezoelectric layers 42 has a substantially rectangular shape in top view.

As depicted in FIG. 5, a right end section 42R of each of the piezoelectric layers 42 is positioned more to a right side than a right end section 26R of a corresponding pressure chamber 26 in the scanning direction (the left-right direction). Moreover, a left end section 42L of each of the piezoelectric layers 42 is positioned more to a left side than a left end section 26L of the corresponding pressure chamber 26 in the scanning direction, and extends to a region overlapping the common liquid chamber 28 in the up-down direction. In other words, the left end section 42 of each of the piezoelectric layers 42 is positioned more to the left side than the channel 29 in the scanning direction. Moreover, in the conveyance direction (the front-rear direction), a rear end of the piezoelectric layer 42 is positioned more rearwards than a rear end of the corresponding pressure chamber 26, and a front end of the piezoelectric layer 42 is positioned more frontwards than a front end of the corresponding pressure chamber 26 and the channel 29 communicating with this corresponding pressure chamber 26. Thus, a length in the conveyance direction of each of the piezoelectric layers 42 is longer than a length in the conveyance direction of the pressure chamber 26. Moreover, a length in the scanning direction of each of the piezoelectric layers 42 is longer than a length in the scanning direction of the pressure chamber 26. Moreover, each of the piezoelectric layers 42 is disposed so as to cover the corresponding pressure chamber 26 and the channel 29 communicating with that corresponding pressure chamber 26.

As depicted in FIGS. 4 and 5, a plurality of the individual electrodes 43 are formed in positions respectively corresponding to the plurality of pressure chambers 26, on an upper surface of each of the piezoelectric layers 42. The individual electrode 43 has a rectangular planar shape which is a size smaller than that of the pressure chamber 26. The individual electrode 43 is formed by the likes of platinum (Pt) or iridium (Ir), for example.

As depicted in FIG. 5, in the conveyance direction, a rear end of the individual electrode 43 is positioned more frontwards than a rear end of a corresponding pressure chamber 26, and a front end of the individual electrode 43 is positioned more rearwards than a front end of the corresponding pressure chamber 26. Moreover, in the scanning direction, a left end 43L of the individual electrode 43 is positioned more to the right side than the left end 26L of the pressure chamber 26, and a right end 43R of the individual electrode 43 is positioned more to the right side than the right end 26R of the pressure chamber 26. Thus, the left end 26L of the pressure chamber 26 and the channel 29 are located between the left end 42L of the piezoelectric layer 42 and the left end 43L of the individual electrode 43 in the scanning direction.

The right end 26R of the pressure chamber 26 is located between the right end 42R of the piezoelectric layer 42 and the right end 43R of the individual electrode 43 in the scanning direction.

Note that the insulating film 30 is disposed between the previously mentioned doped layer 32 and common electrode 41. As depicted in FIGS. 4 and 5, in top view, through holes 51 are respectively formed in positions between two channels 29 in the conveyance direction and sandwiched by the pressure chamber 26 and the common liquid chamber 28 in the scanning direction. As depicted in FIG. 6, the through hole 51 is a through hole penetrating the insulating film 30, and one of the piezoelectric layers 42 is disposed above each of the through holes 51. Moreover, an inside of each of the through holes 51 is filled with a conductive material. As a result, the doped layer 32 and the common electrode 41 are electrically continuous via the conductive material on the inside of each of the through holes 51. As will be mentioned later, the common electrode 41 is held at ground potential, hence a potential of the doped layer 32 is also held at ground potential.

Furthermore, as depicted in, for example, FIGS. 6 to 8, the protective film 46 is formed so as to cover the plurality of piezoelectric elements 44 and the insulating film 30. Note that as depicted in FIGS. 2 and 4, the protective film 46 is formed over substantially the entire region of the upper surface of the channel substrate 21. The protective film 46 prevents moisture included in the air from infiltrating into the piezoelectric layer 42. The protective film 46 is formed by a material having water resistance, such as alumina ($Al_2O_3$). Alternatively, the protective film 46 may be formed by silicon dioxide ($SiO_2$).

Note that in order to lessen hindrance to deformation of the piezoelectric layer 42 due to the protective film 46, a rectangular shaped opening 46a is formed in a portion overlapping the individual electrode 43 formed on the upper surface of the piezoelectric layer 42, of the protective film 46, when viewed from a thickness direction of the protective film 46 (refer to FIGS. 4 and 6). As depicted in FIG. 4, the opening 46a is formed so as to be a size smaller than the individual electrode 43. As a result, substantially all of a portion excluding an outer peripheral portion of the individual electrode 43 is exposed from the protective film 46. Note that on an inner side of the opening 46a, the piezoelectric layer 42 is not covered by the protective film 46. However, because the piezoelectric layer 42 is covered by the individual electrode 43 in said portion, infiltration of moisture into the piezoelectric layer 42 from outside is suppressed.

The protective film 46 functions additionally as a film of an insulator. The continuity section 52 disposed so as to penetrate the protective film 46 is provided in a portion covering an end section on a right side of each of the individual electrodes 43, of the protective film 46 (refer to FIGS. 4 and 6). Moreover, as depicted in FIGS. 4 to 6, the wirings 45 extending toward the right side respectively extend from the continuity sections 52 provided in each of the piezoelectric elements 44. Although FIG. 2 omits illustration of the continuity sections 52, FIG. 2 does illustrate that the wirings 45 extend toward the right side from the piezoelectric elements 44 disposed in a column corresponding to the pressure chamber column 27 on the right side, of the two pressure chamber columns 27. These wirings 45 are referred to as wirings 45a. In addition, the wirings 45 extending toward the right side respectively extend also from each of the piezoelectric elements 44 disposed in a column corresponding to the pressure chamber column 27 on the left side, of the two pressure chamber columns 27. These wirings 45 are referred to as wirings 45b. The wirings 45b extend to the right side of FIG. 2 passing between the piezoelectric elements 44 disposed in a column corresponding to the pressure chamber column 27 on the right side. Moreover, a plurality of the drive contacts 53 are disposed aligned in the conveyance direction on the protective film 46, in a right end section of the channel substrate 21. The wirings 45 (the wirings 45a, 45b) led out rightwards from the individual electrodes 43 (the continuity sections 52) are respectively connected to the drive contacts 53. One end section (a left end section) of each of the wirings 45 is connected to one of the continuity sections 52, and the other end section (a right end section) of each of the wirings 45 is connected to one of the drive contacts 53. Each of the wirings 45 is continuous with the individual electrode 43 via the continuity section 52. Moreover, two of the ground contacts 54 are also disposed on both sides in the conveyance direction of the plurality of drive contacts 53, in the right end section of the channel substrate 21. The ground contact 54 is connected, via a continuity section (illustration of which is omitted) penetrating the protective film 46, to the common electrode 41 disposed on a lower side of the protective film 46. The wirings 45a, 45b, the continuity section 52, the drive contact 53, and the ground contact 54 are formed by platinum (Pt), gold (Au), aluminum (Al), or the like.

As depicted in FIG. 2, a COF (Chip On Film) 50 which is a wiring member is joined to an upper surface of the right end section of the channel substrate 21. Moreover, a plurality of wirings (not illustrated) formed in the COF 50 are respectively electrically connected to the plurality of drive contacts 53 and the plurality of ground contacts 54. An end section on an opposite side to the drive contacts 53, of the COF 50 is connected to the controller 7 of the printer 1 (refer to FIG. 1). Moreover, the COF 50 is mounted with a driver IC 50A.

The driver IC 50A generates and outputs a drive signal for driving the piezoelectric element 44, based on a control signal sent from the controller 7. The drive signal outputted from the driver IC 50A is inputted to the drive contact 53 via the wiring of the COF 50, and is further supplied to the individual electrode 43 via the wiring 45. A potential of the individual electrode 43 supplied with the drive signal changes between a certain drive potential and ground potential. Moreover, a ground wiring is also formed in the COF 50, and this ground wiring is electrically connected to the ground contact 54. As a result, a potential of the common electrode (the lower electrode) 41 connected to the ground contact 54 is always maintained at ground potential.

Operation of the piezoelectric element 44 when the drive signal has been supplied from the driver IC 50A will be described. In a state where the drive signal is not supplied, the potential of the individual electrode 43 is ground potential, and is the same potential as the common electrode 41. When, from this state, the drive signal is supplied to the individual electrode 43 whereby the drive potential is applied to the individual electrode 43, a potential difference occurs between that individual electrode 43 and the common electrode 41. As a result of this potential difference, an electric field parallel to a thickness direction of the piezoelectric layer 42 acts on a portion sandwiched by the individual electrode 43 and the common electrode 41, of the piezoelectric layer 42. At this time, the piezoelectric layer 42 extends in the thickness direction and contracts in a surface direction, due to a piezoelectric inverse effect. Furthermore, the insulating film 30 bends convexly to a pressure chamber 26 side along with this contraction deformation of the piezoelectric film. As a result, the capacity of the pressure chamber 26 decreases, whereby a pressure wave is generated in the pressure chamber 26 and a droplet of ink is discharged from the nozzle 24 communicating with the pressure chamber 26.

Note that because the insulating film 30 is extremely thin, there is a possibility of a crack occurring in it in a manufacturing step of the ink-jet head 5. When a crack has occurred in the insulating film 30, there is a risk that if ink in the pressure chamber 26 is positively or negatively charged, the charged ink is attracted to the grounded common electrode 41 and thereby infiltrates into the crack. This is because when ink in the pressure chamber 26 is positively or negatively charged, a potential of the ink is unstable and a potential difference sometimes occurs between the ink and the common electrode 41. In such a case, the charged ink sometimes infiltrates into the crack of the insulating film 30, whereby the ink and the common electrode 41 of the piezoelectric element 44 short-circuit. In that case, it becomes impossible for ink to be discharged normally from the nozzle corresponding to the piezoelectric element 44 that has short-circuited with the ink. Moreover, in some cases, the piezoelectric element 44 that has short-circuited with the ink may also sometimes be destroyed.

In contrast, in the present embodiment, as mentioned above, the upper surface of the pressure chamber 26 is partitioned by the doped layer 32, and the doped layer 32 is electrically continuous with the common electrode 41 thereby being held at ground potential. Because ink in the pressure chamber 26 is in contact with the doped layer 32 partitioning the upper surface of the pressure chamber 26, the ink is always held at ground potential. As a result, charging of the ink can be suppressed, and the potential of the ink can be kept to the same as the potential of the common electrode 41. As a result, the ink in the pressure chamber 26 can be prevented from being attracted to the common electrode 41 and thereby infiltrating into the crack. Note that the potential of the common electrode 41 need only be held at a constant potential and need not necessarily be ground potential.

Next, manufacturing steps of the above-mentioned head unit 16 of the ink-jet head 5 will be described particularly with reference to FIGS. 9A to 13C.

Figure 9A:
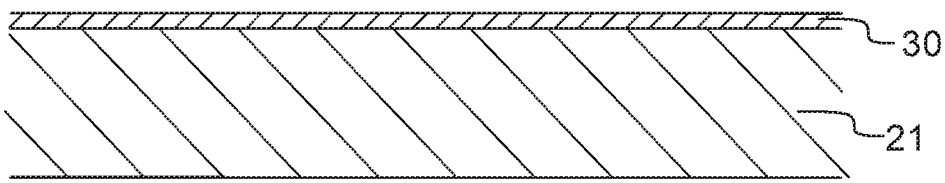
FIG. 9A is a view depicting a deposition step of an insulating film.

First, as depicted in FIG. 9A, the insulating film 30 of silicon dioxide is deposited on a surface of the channel substrate 21 which is a silicon substrate. A publicly known deposition method can be employed as a deposition method of the silicon dioxide insulating film 30. For example, thermal oxidation treatment can be suitably adopted. Note that the insulating film 30 need not necessarily be of silicon dioxide. The insulating film 30 can be formed by a material other than silicon dioxide, by any deposition method. Moreover, the insulating film 30 may be formed as a multi-layer film.

Figure 9B:
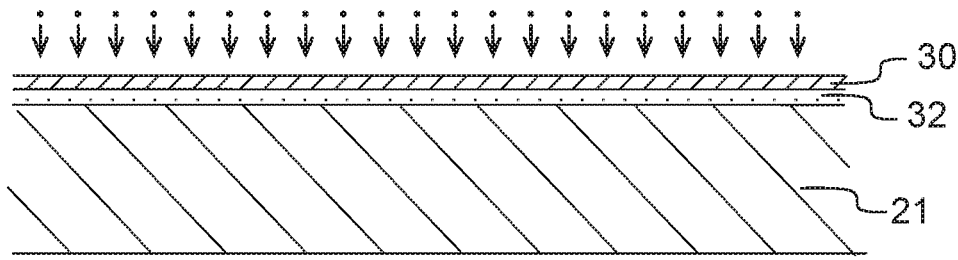
FIG. 9B is a view depicting a deposition step of a doped layer.

Next, as depicted in FIG. 9B, an unillustrated ion implanting apparatus is employed to implant from the surface of the channel substrate 21 (a surface where the insulating film 30 has been formed, of the channel substrate 21) ions such as sodium ions and thereby form the doped layer 32 on a lower side of the insulating film 30. Now, a standard ion implanting apparatus includes: an ion source that generates an intended ion; an accelerator that accelerates the ion by an electric field; a mass separator that selects only the intended ion; and a holder that holds a target to be an object of implantation, and these are disposed inside a vacuum chamber. The channel substrate 21 is held in the holder inside the vacuum chamber, and the ion accelerated by the accelerator is implanted in the channel substrate 21. A depth that the ion is implanted in the channel substrate 21 can be adjusted by adjusting an accelerating voltage of the accelerator. In the present embodiment, the accelerating voltage of the accelerator is adjusted such that the doped layer 32 is formed in a region contacting the insulating film 30, immediately on the lower side of the insulating film 30. Moreover, an amount of ions implanted per unit area is adjusted such that the doped layer 32 is formed with a uniform ion concentration. Note that the doped layer 32 need not necessarily be formed using an ion implanting apparatus, and may be formed by doping with an impurity ion using any publicly known method.

Note that the above-mentioned step of depositing the insulating film 30 and step of forming the doped layer 32 need not be performed in the above-described order, and it is possible for the doped layer 32 to be formed first, after which the insulating film 30 is deposited. For example, it is also possible for the doped layer 32 to be formed using the ion implanting apparatus, after which the silicon dioxide insulating film 30 is deposited by thermal oxidation treatment on the upper surface of the doped layer 32. Moreover, it is also possible for the doped layer 32 to be formed by another publicly known method besides the method employing the ion implanting apparatus, after which the insulating film 30 of silicon dioxide or another material is deposited on the upper surface of the doped layer 32 using a publicly known deposition method.

Figure 9C:
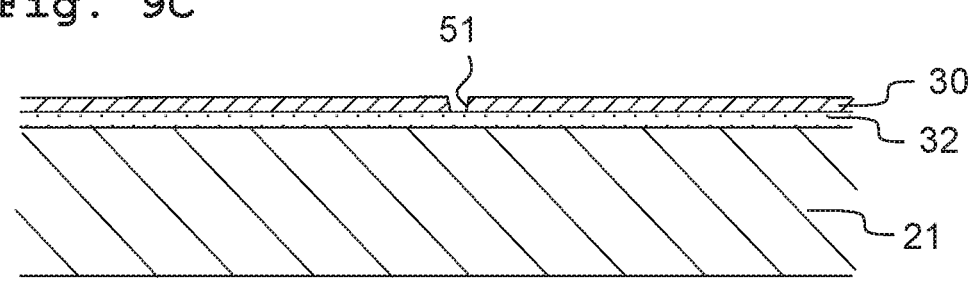
FIG. 9C is a view depicting a formation step of a hole for continuity of the doped layer and a common electrode.

Next, as depicted in FIG. 9C, the through hole 51 is formed in the insulating film 30 by etching. This through hole 51 is a hole for rendering electrically continuous the doped layer 32 and the common electrode 41 to be formed on the insulating film 30 in the next step. Note that the through hole 51 is formed in a position that will overlap the piezoelectric layer 42 when the piezoelectric layer 42 has been formed in a later step.

Figure 9D:
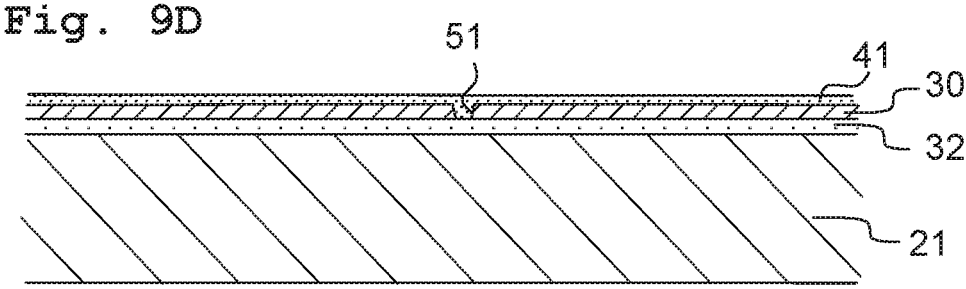
FIG. 9D is a view depicting a deposition step of the common electrode.
Figure 9E:
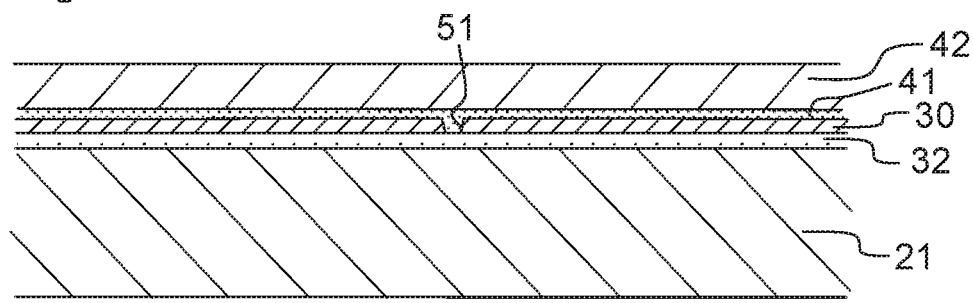
FIG. 9E is a view depicting a deposition step of a piezoelectric material film.

Next, as depicted in FIG. 9D, the common electrode 41 is deposited by the likes of sputtering, over an entire region of the upper surface of the insulating film 30. At this time, part of a conductive material forming the common electrode 41 is filled into the through hole 51, whereby a continuity section that renders electrically continuous the common electrode 41 and the doped layer 32 is formed on an inner side of the through hole 51. Next, as depicted in FIG. 9E, a piezoelectric material film 42A configured from a piezoelectric material such as PZT is deposited in an entire region of the upper surface of the common electrode 41 by the likes of a sol-gel method or sputtering.

Figure 10A:
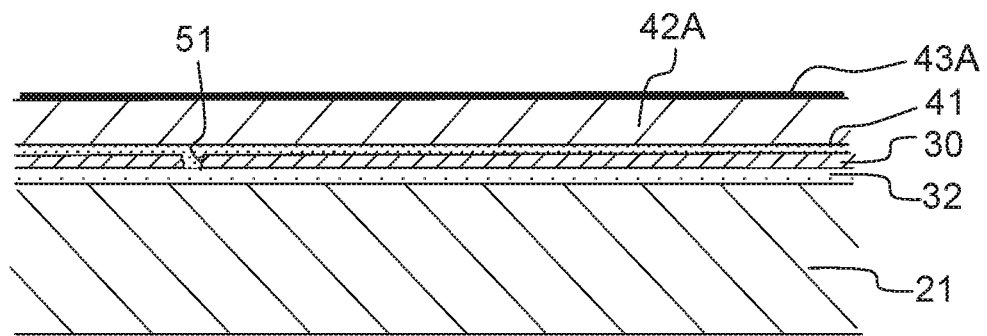
FIG. 10A is a view depicting a formation step of a conductive film for an individual electrode.
Figure 10B:
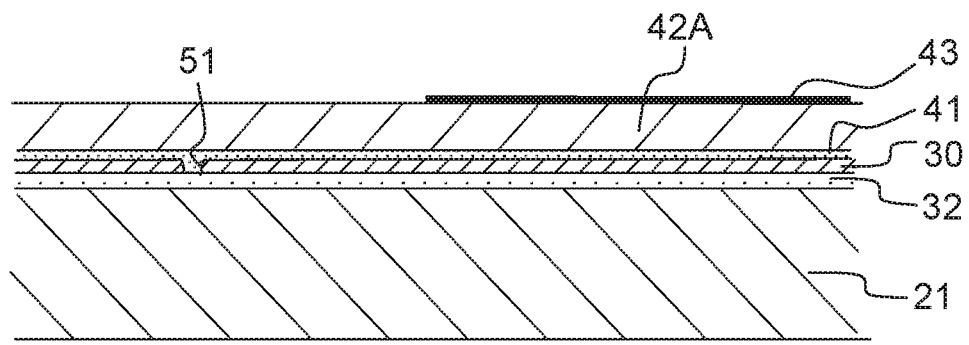
FIG. 10B is a view depicting a formation step of the individual electrode.

Furthermore, the individual electrode 43 is formed on an upper surface of the piezoelectric material film 42A. First, as depicted in FIG. 10A, a conductive film 43A is deposited on the upper surface of the piezoelectric material film 42A by the likes of sputtering. Then, as depicted in FIG. 10B, etching is carried out on the conductive film 43A, whereby a plurality of the individual electrodes 43 are each formed on the upper surface of the piezoelectric material film 42A.

Figure 10C:
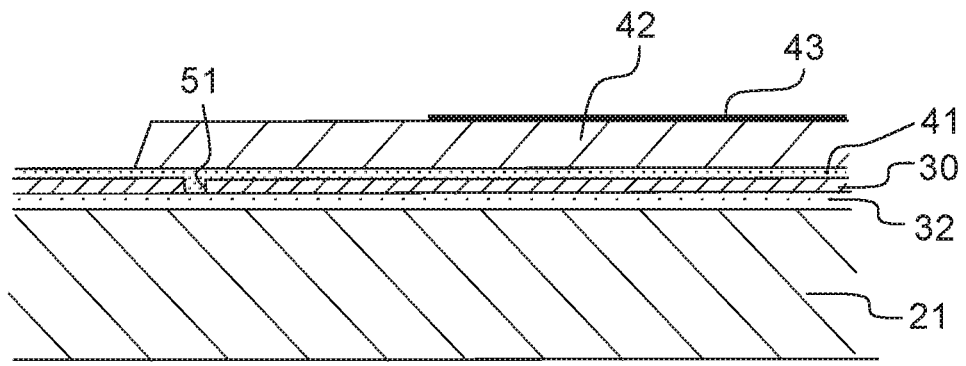
FIG. 10C is a view depicting an etching step of the piezoelectric material film.

As depicted in FIG. 10C, etching of the piezoelectric material film 42A is performed to form the piezoelectric layer 42. As a result, the plurality of piezoelectric elements 44 are formed on the insulating film 30.

Figure 11A:
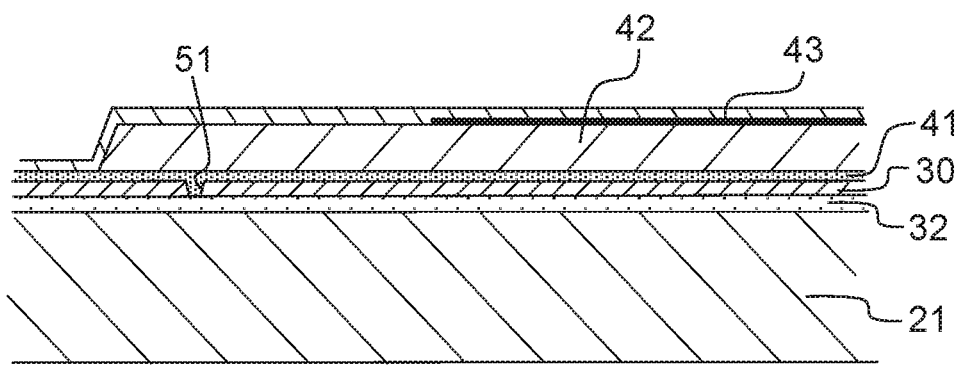
FIG. 11A is a view depicting a deposition step of a protective film.

Next, as depicted in FIG. 11A, the protective film 46 of silicon dioxide is deposited by sputtering or the like, so as to cover the plurality of piezoelectric elements 44 and the common electrode 41. Note that the protective film 46 can also be deposited as a film configured from silicon nitride or another insulating material. Moreover, the protective film 46 can also be formed as a multi-layered insulating film.

Figure 11B:
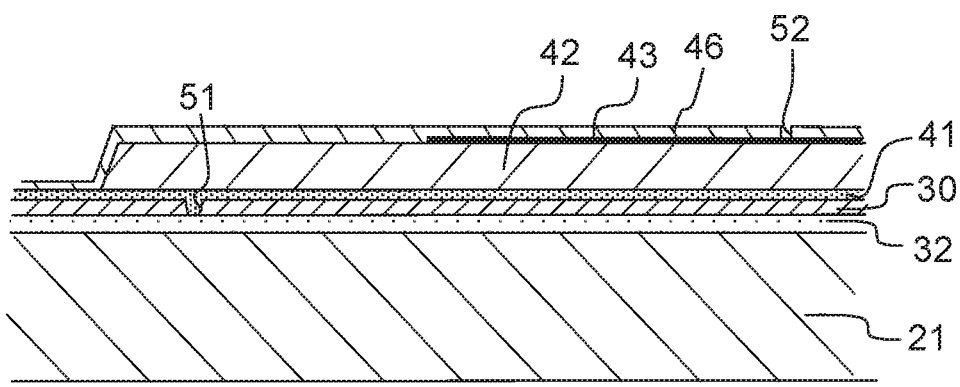
FIG. 11B is a view depicting a step of hole formation for continuity of the individual electrode and a wiring.

After the protective film 46 has been formed, a hole 56 is formed by etching, in a portion covering an end section of the individual electrode 43, of the protective film 46, as depicted in FIG. 11B. This hole 56 is a hole for rendering electrically continuous the individual electrode 43 and the wiring 45 to be formed on the protective film 46 in the next step.

Figure 12A:
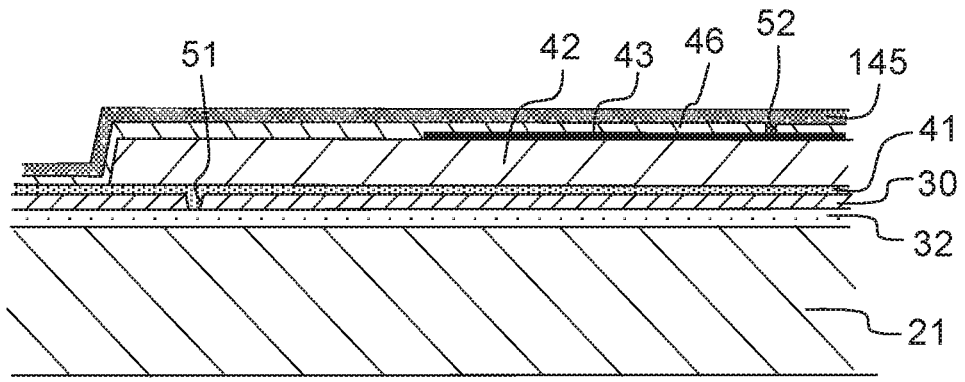
FIG. 12A is a view depicting a deposition step of a conductive film for the wiring.
Figure 12B:
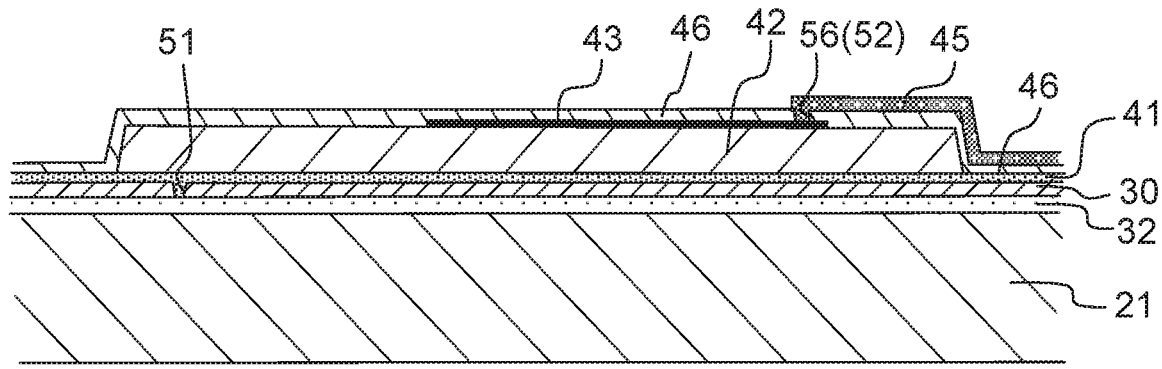
FIG. 12B is a view depicting an etching step (wiring formation step) of the conductive film for the wiring.

Next, the plurality of wirings 45 are formed on the protective film 46. First, as depicted in FIG. 12A, a conductive film 145 is deposited, by sputtering or the like, on the upper surface of the protective film 46. At this time, part of a conductive material is filled into the hole 56, whereby the continuity section 52 that renders electrically continuous the individual electrode 43 and the conductive film 145, is formed in the hole 56. Next, as depicted in FIG. 12B, etching is carried out on this conductive film 145, whereby unnecessary portions are removed and the plurality of wirings 45 are respectively formed.

Figure 12C:
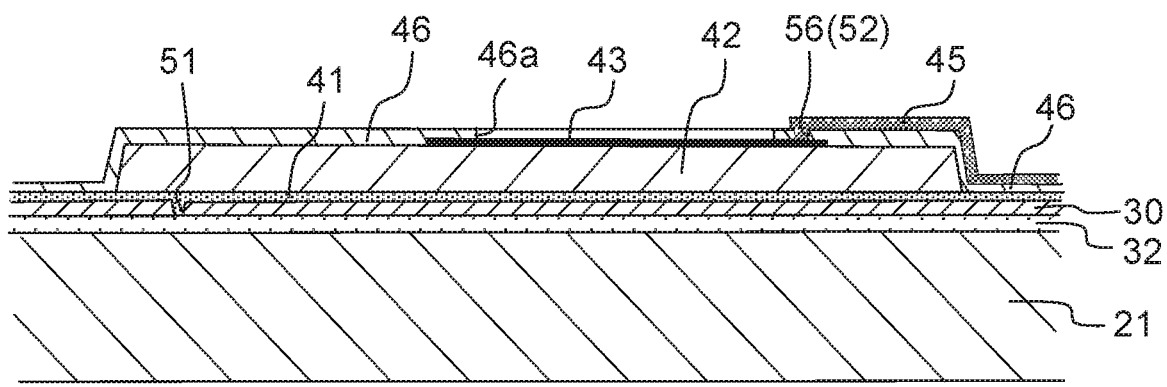
FIG. 12C is a view depicting a partial removal step of the protective film.

Next, as depicted in FIG. 12C, etching is performed on the protective film 46 to remove portions covering the individual electrodes 43 of the plurality of piezoelectric elements 44, of the protective film 46. As a result, the opening 46a is formed in the protective film 46, whereby the individual electrode 43 located below the opening 46a is exposed.

Note that although not particularly required when the wiring 45 is formed by a stable material such as gold, it is preferable that when the wiring 45 is formed by aluminum, a wiring protective film covering the wiring 45 is provided for a purpose of corrosion prevention. In this case, it is possible for etching to be carried out on a conductive film 45A to remove unnecessary portions and thereby form the plurality of wirings 45, and then for a wiring protective film covering the plurality of wirings 45 to be deposited by sputtering or the like. For example, a wiring protective film configured from silicon dioxide or silicon nitride can be deposited. Moreover, in this case, it is possible that when etching is performed on the protective film 46 to remove the portions covering the individual electrodes 43 of the plurality of piezoelectric elements 44, of the protective film 46, simultaneously, portions covering the individual electrodes 43 of the plurality of piezoelectric elements 44, of the wiring protective film are also removed by etching.

Figure 13A:
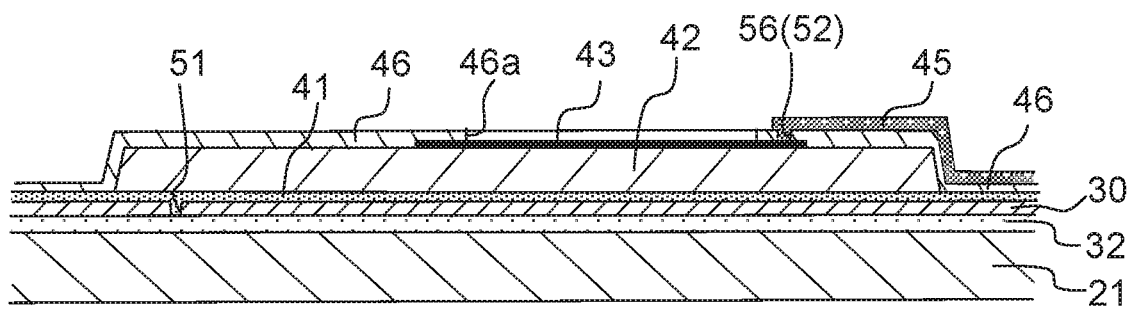
FIG. 13A is a view depicting a polishing step of a channel substrate.

Next, as depicted in FIG. 13A, the channel substrate 21 where the ink channel is formed is removed, by polishing, from a lower surface side (an opposite side to the insulating film 30), and a thickness of the channel substrate 21 is thinned to a certain thickness. Although a thickness of a silicon wafer from which the channel substrate 21 originates is about 500 μm to 700 μm, in this polishing step, the thickness of the channel 21 is thinned to about 100 μm.

Figure 13B:
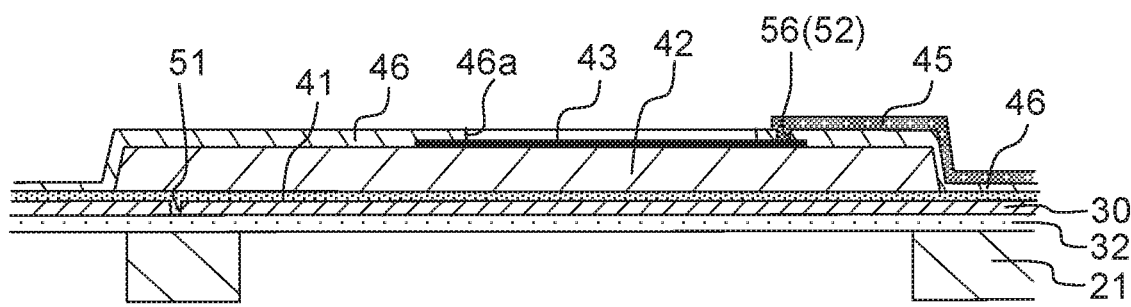
FIG. 13B is a view depicting an etching step (formation step of a pressure chamber, a channel, and a common liquid chamber) of the channel substrate.
Figure 13C:
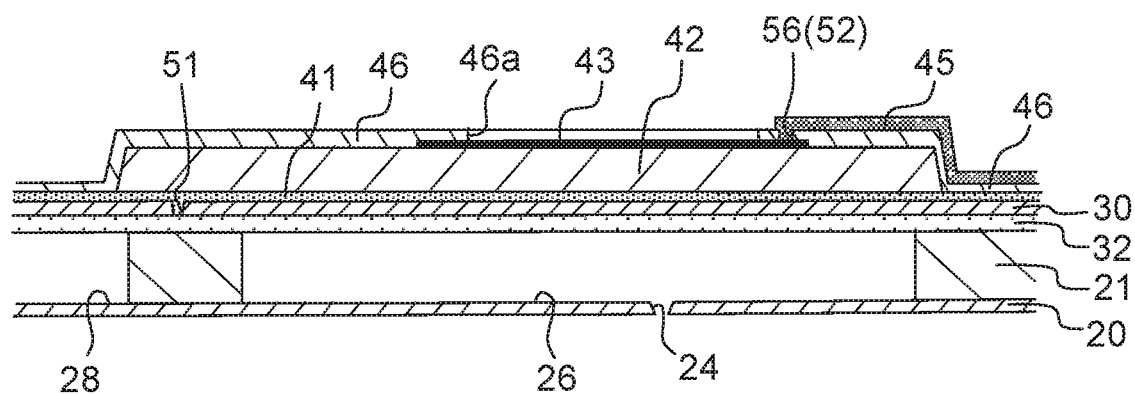
FIG. 13C is a view depicting a joining step of a nozzle plate.

After the above-described polishing, etching is performed from the lower surface side on the opposite side to the insulating film 30, of the channel substrate 21, as depicted in FIG. 13B, whereby the plurality of pressure chambers 26, the common liquid chamber 28, and the channels 29 are formed. Note that this etching of the channel substrate 21 may be wet etching or dry etching. Note that when forming the pressure chamber 26, etching is performed on the channel substrate 21 to a depth that the doped layer 32 is exposed. Moreover, as depicted in FIG. 13C, the nozzle plate 20 in which the plurality of nozzles 24 have been formed is joined by an adhesive agent to the lower surface of the channel substrate 21, at a certain position.

In the embodiment described above, the channel substrate 21 corresponds to a "semiconductor substrate" of the present teaching, and the insulating film 30 corresponds to an "insulating film" of the present teaching. The piezoelectric element 44 corresponds to a "first piezoelectric element" and a "second piezoelectric element" of the present teaching. The doped layer 32 corresponds to a "doped layer" of the present teaching. The through hole 51 corresponds to a "through hole having a conductor disposed on its inside" of the present teaching.

Next, modified modes where various changes have been made to the previously described embodiment will be described. However, configurations of the modified modes similar to those of the previously described embodiment will be assigned with the same symbols as those assigned in the previously described embodiment, and descriptions thereof will be appropriately omitted. Note that the modified modes depicted below are merely exemplifications, and the present teaching is not limited to these. Moreover, the modified modes below may also be appropriately combined.

Figure 14:
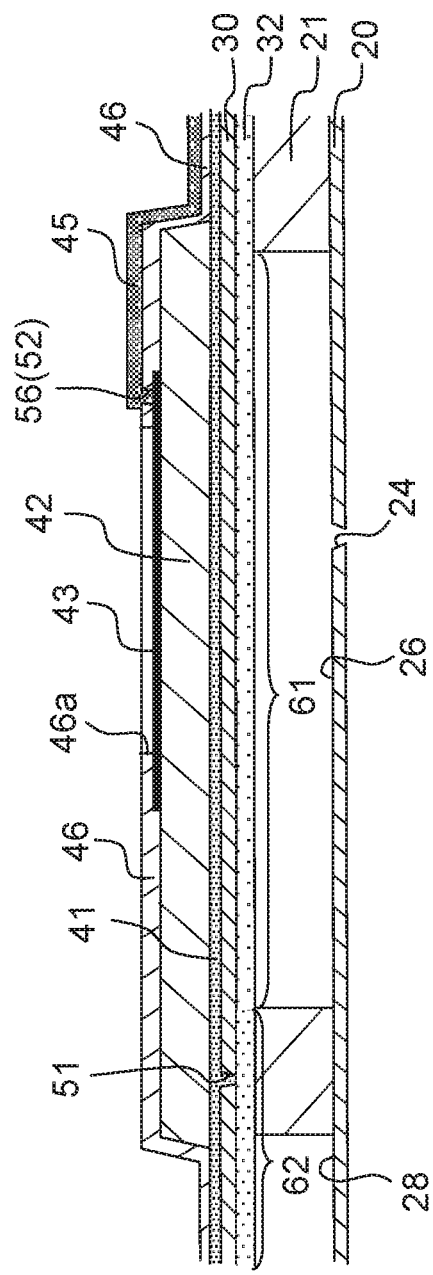
FIG. 14 is a schematic explanatory view of the doped layer including a region having two kinds of ion concentrations.

In the previously described embodiment, when forming the doped layer 32, the amount of ions implanted per unit area was adjusted such that the doped layer 32 was formed with a uniform ion concentration. However, the ion concentration is not necessarily required to be uniform in the doped layer 32. For example, as depicted in FIG. 14, concentrations of ions implanted in the doped layer 32 can be changed for an overlapping region 61 that overlaps the individual electrode 43 of the piezoelectric element 44 and an outer peripheral region 62 that surrounds said overlapping region 61. Specifically, it is possible for concentration of ions implanted in the outer peripheral region 62 of the doped layer 32 to be made higher than concentration of ions implanted in the overlapping region 61 of the doped layer 32, and for the doped layer 32 to be rendered electrically continuous with the common electrode 41 in the outer peripheral region 62. By providing an outer side of the piezoelectric element 44 with a region where ions have been implanted with high concentration (the outer peripheral region 62), electrostatic noise (ESD noise) from outside the ink-jet head 5 can be allowed to escape to the common electrode 41 via the outer peripheral region 62 where the ions have been implanted with high concentration. As a result, misprinting or destruction of the piezoelectric element 44 due to ESD noise from outside the ink-jet head 5 can be avoided.

Figure 15:
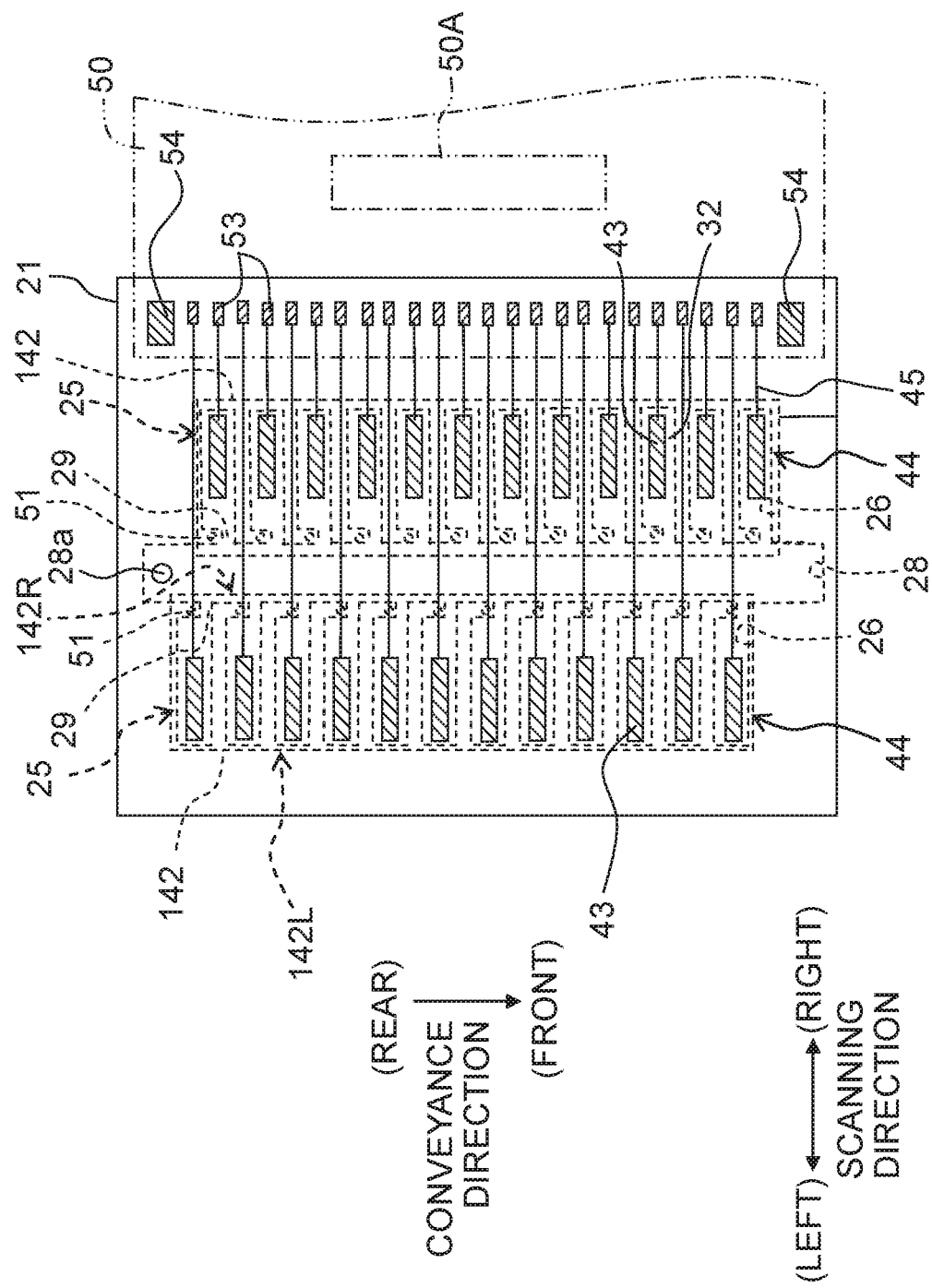
FIG. 15 is a view corresponding to FIG. 2 of a head unit 16A having a piezoelectric layer provided commonly to pressure chamber columns 25.

In the previously described embodiment, the plurality of piezoelectric elements 44 were provided respectively corresponding to the plurality of pressure chambers 26. The piezoelectric layer 42 and the individual electrode 43 were separately provided to each of the piezoelectric elements 44. In contrast, the common electrode 41 was provided commonly to all of the plurality of piezoelectric elements 44. The present teaching is not limited to such a mode. The piezoelectric layer 42 may be provided so as to straddle a plurality of the pressure chambers 26. For example, as depicted in FIG. 15, two piezoelectric layers 142 long in the conveyance direction may be formed corresponding to the two pressure chamber columns 27. Each of the piezoelectric layers 142 extends in the conveyance direction so as to cover all of the pressure chambers 26 configuring one of the pressure chamber columns 27. Note that a left end 142L and a right end 142R in the scanning direction of the piezoelectric layer 142 are respectively in the same positions as the left end 42L and the right end 42R of the piezoelectric layer 42 in the above-mentioned embodiment. Therefore, a description regarding the positions of the left end 142L and the right end 142R will be omitted here.

Although it is the case that the piezoelectric layer 142 is provided commonly to the pressure chambers 26 configuring one pressure chamber column 27, one piezoelectric element 44 is configured with respect to one pressure chamber 26 by the individual electrode 43 and the common electrode 41 facing this one pressure chamber 26 and by a portion sandwiched by the individual electrode 43 and the common electrode 41, of the piezoelectric layer 142. Note that the piezoelectric layer 142 need not be divided into two corresponding to the pressure chamber columns 27, and it is possible for one piezoelectric layer to be provided so as to cover all of the pressure chambers 26 of the two pressure chamber columns 27.

In the previously described embodiment, the plurality of pressure chambers 26 configured two pressure chamber columns 27, and the arrangement of the plurality of piezoelectric elements 44 was also configured as two columns in accordance with this arrangement of the pressure chambers 26. However, the number of columns of pressure chambers 26 or piezoelectric elements 44 is not limited to two, and may be one, or may be three or more. Moreover, as depicted in FIGS. 7 and 8, the channel 29 joining the common liquid chamber 28 and the pressure chamber 26 is formed such that its width in the conveyance direction is narrower than that of the pressure chamber 26. Note that a depth of the channel 29 (a length in a thickness direction of the channel substrate 21) was the same as a depth of the pressure chamber 26. However, the present teaching is not limited to such a mode. For example, the depth of the channel 29 may be configured so as to be smaller than the depth of the pressure chamber 26. In this case, the channel resistance of the channel 29 can be made even larger and it is further suppressed that the pressure wave generated in the ink in the pressure chamber 26 escapes to the common liquid chamber 28. Note that as mentioned above, the channel 29 and the pressure chamber 26 are formed by etching the channel substrate 21. At this time, the depth of the channel 29 can be made shallower than the depth of the pressure chamber 26 by adjusting a depth of etching.

In the above-described embodiment, the doped layer 32 covered above each of the pressure chambers 26 so as to partition the entire upper surface of the pressure chamber 26. However, the present teaching is not limited to such a configuration. It is possible for the doped layer 32 to be exposed in at least part of the pressure chamber 26 so that the doped layer 32 partitions part of the pressure chamber 26. In the above-described embodiment, when forming the plurality of pressure chambers 26, the common liquid chamber 28, and the channels 29 by etching (refer to FIG. 13B), etching was performed on the channel substrate 21 to a depth that the doped layer 32 was exposed. However, it is possible for etching to be performed more deeply than to the depth that the doped layer 32 is exposed and for the doped layer 32 to be removed and the insulating film 30 exposed. Even in this case, the doped layer 32 can be exposed in a stripe shape on a side surface of the pressure chamber 26. Therefore, when the inside of the pressure chamber 26 has been filled with ink, the ink and the doped layer 32 can be brought into contact with each other.

In the previously described embodiment, the conductive material disposed in the through hole 51 which is the hole for rendering electrically continuous the doped layer 32 and the common electrode 41, was electrically continuous with the common electrode 41 by making direct contact with the common electrode 41. However, the conductive material disposed in the through hole 51 and the common electrode 41 do not necessarily need to make direct contact. For example, the conductive material disposed in the through hole 51 and the common electrode 41 may be in electrical contact via a wiring.

Moreover, in the previously described embodiment, the through hole 51 which is the hole for rendering electrically continuous the doped layer 32 and the common electrode 41 was formed in a position overlapping the piezoelectric layer 42 in the up-down direction and between two channels 29 in the conveyance direction. However, the position where the through hole 51 is formed is not limited to the above-described position, and it may be formed in any position of the insulating film 30. For example, it may be formed between two pressure chambers 26 in the conveyance direction, as in a through hole 251 depicted in FIG. 16. As a result of the through hole 51 being thus disposed in a position overlapping the piezoelectric layer 42 in the up-down direction or in a position sandwiched by two channels 29 in the conveyance direction or between two pressure chambers 26 in the conveyance direction, it becomes unnecessary to secure a special region for providing the through holes 51, 251. Therefore, an increase in size of the head unit 16 can be suppressed.

Note that in the previously described embodiment, a plurality of the through holes 51 were provided corresponding to the number of pressure chambers 26. However, the number of through holes 51 is not limited to that of the above-described embodiment, and may be set to any number.

In the previously described embodiment, when employing the ion implanting apparatus to form the doped layer 32 after depositing the insulating film 30 on the surface of the channel substrate 21, ions were implanted from a side of a surface where the insulating film 30 was formed, of the channel substrate 21. Adjusting the accelerating voltage of the accelerator accelerating the ions makes it possible to adjust to what depth the ions are implanted. Therefore, the ions do not necessarily need to be implanted from the side of the surface where the insulating film 30 is formed, of the channel substrate 21, and the ions may be implanted from a surface on an opposite side to the surface where the insulating film 30 is formed, of the channel substrate 21.

In the embodiment described above, the present teaching was applied to the ink-jet head 5 that discharges ink onto a recording sheet to print an image or the like. In the above-described embodiment, the ink-jet head 5 was a so-called serial type ink-jet head, but the present teaching is not limited to this and may be applied also to a so-called line type ink-jet head. Moreover, the present teaching is not limited to an ink-jet head that discharges ink. The present teaching may be applied also to a liquid discharge apparatus used in a variety of applications besides printing of an image or the like. For example, it is possible to apply the present teaching also to a liquid discharge apparatus that discharges a conductive liquid onto a substrate to form a conductive pattern on a substrate surface.

What is claimed is:

1. A liquid discharge head comprising:
a substrate including a first pressure chamber;
an insulating film disposed above the first pressure chamber; and
a first piezoelectric element disposed on an opposite side to the first pressure chamber of the insulating film, in a first direction in which the first pressure chamber and the insulating film overlap,
the first piezoelectric element including:
a first electrode disposed above the insulating film;
a piezoelectric layer disposed above the first electrode; and
a second electrode disposed above the piezoelectric layer,
wherein the substrate further includes a layer,
wherein the layer defines at least part of the first pressure chamber,
wherein the layer has a lower electrical resistivity than the insulating film and the substrate,
wherein the insulating film includes a through hole in which a conductor is disposed, and the first electrode and the layer are electrically connected to the conductor disposed in the through hole
wherein the substrate includes a channel and a communicating chamber communicating with the first pressure chamber via the channel,
wherein the communicating chamber and the first pressure chamber are separated in a second direction, and
wherein the through hole is formed in the insulating film at a position between the communicating chamber and the first pressure chamber in the second direction, the position being aligned with the channel in a third direction orthogonal to the second direction.

2. The liquid discharge head according to claim 1, wherein the substrate is a silicon substrate, and wherein the insulating film is a silicon oxide film or a silicon nitride film.

3. The liquid discharge head according to claim 1, wherein the layer is disposed to cover at least part of a surface, of the first pressure chamber, facing the insulating film in the first direction.

4. The liquid discharge head according to claim 1, wherein the conductor disposed in the through hole is in direct contact with the first electrode so that the conductor is electrically connected to the first electrode.

5. The liquid discharge head according to claim 1, wherein the conductor disposed in the through hole is in direct contact with a wiring extending from the first electrode so that the conductor is electrically connected to the first electrode.

6. The liquid discharge head according to claim 1, wherein the layer comprises:
a first portion partitioning at least part of the first pressure chamber; and
a second portion disposed between the first portion and the conductor of the through hole, the second portion having a smaller electrical resistivity than the first portion.

7. The liquid discharge head according to claim 1, wherein the substrate includes a second pressure chamber adjacent to the first pressure chamber in a fourth direction orthogonal to the first direction,
wherein the insulating film is disposed to cover the first pressure chamber and the second pressure chamber,
wherein the liquid discharge head further comprises a second piezoelectric element disposed on an opposite side to the second pressure chamber of the insulating film, in the first direction,
wherein the second piezoelectric element includes a third electrode connected to the first electrode of the first piezoelectric element, and
wherein the through hole is disposed between the first pressure chamber and the second pressure chamber, of the insulating film, and is electrically connected to the first electrode or the third electrode.

8. The liquid discharge head according to claim 1, wherein the through hole is formed in a position overlapping the piezoelectric layer in the first direction.

9. The liquid discharge head according to claim 1, wherein the layer is a doped layer.

10. A liquid discharge apparatus comprising:
the liquid discharge head as defined in claim 1;
a conveyance mechanism configured to convey a medium toward the liquid discharge head; and
a tank configured to supply liquid to the liquid discharge head.

* * * * *